(12) United States Patent
Farhoodfar et al.

(10) Patent No.: US 10,567,005 B2
(45) Date of Patent: *Feb. 18, 2020

(54) TIME VARYING DATA PERMUTATION APPARATUS AND METHODS

(71) Applicant: INPHI CORPORATION, Santa Clara, CA (US)

(72) Inventors: Arash Farhoodfar, Kanata (CA); Frank R. Kschischang, Mississauga (CA); Benjamin P. Smith, Toronto (CA); Andrew Hunt, Ottawa (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/134,311

(22) Filed: Sep. 18, 2018

(65) Prior Publication Data

US 2019/0020356 A1   Jan. 17, 2019

Related U.S. Application Data

(63) Continuation of application No. 15/378,904, filed on Dec. 14, 2016, now Pat. No. 10,110,252, which is a
(Continued)

(51) Int. Cl.
*H03M 13/00* (2006.01)
*H03M 13/27* (2006.01)
*H04L 1/00* (2006.01)

(52) U.S. Cl.
CPC ..... *H03M 13/2778* (2013.01); *H03M 13/271* (2013.01); *H03M 13/2707* (2013.01);
(Continued)

(58) Field of Classification Search
CPC ......... H03M 13/2778; H03M 13/2707; H03M 13/2742; H03M 13/6502; H03M 13/0071;
(Continued)

(56) References Cited

U.S. PATENT DOCUMENTS 3,700,819 A     10/1972  Marcus
6,748,566 B1 *   6/2004  Laroia ..................... H04L 1/004
                                                                  370/342
(Continued)

OTHER PUBLICATIONS

"Interfaces for the Optical Transport Network (OTN)". Amendment 1: International Telecommunication Union; ITU-T; G709/Y.1331 (Jul. 2010). Series G: Transmission Systems and Media, Digital Systems and Networks; Digital terminal equipments—General; Series Y: Global Information Infrastructure, Internet Protocol Aspects and Next-Generation Networks; Internet Protocol Aspects—Transport.
(Continued)

*Primary Examiner* — Samir W Rizk
(74) *Attorney, Agent, or Firm* — Richard T. Ogawa; Ogawa P.C.

(57) ABSTRACT

Multiple data permutation operations in respective different dimensions are used to provide an overall effective data permutation using smaller blocks of data in each permutation than would be used in directly implementing the overall permutation in a single permutation operation. Data that has been permuted in one permutation operation is block interleaved, and the interleaved data is then permuted in a subsequent permutation operation. A matrix transpose is one example of block interleaving that could be applied between permutation operations.

20 Claims, 5 Drawing Sheets

Related U.S. Application Data continuation of application No. 14/540,907, filed on Nov. 13, 2014, now Pat. No. 9,564,926, which is a continuation of application No. 14/066,332, filed on Oct. 29, 2013, now Pat. No. 8,910,016, which is a continuation of application No. 13/190,194, filed on Jul. 25, 2011, now Pat. No. 8,601,340.

(52) U.S. Cl.
CPC ... *H03M 13/2742* (2013.01); *H03M 13/2757* (2013.01); *H03M 13/2767* (2013.01); *H03M 13/2782* (2013.01); *H03M 13/6502* (2013.01); *H04L 1/0071* (2013.01)

(58) Field of Classification Search
CPC ........... H03M 13/2757; H03M 13/271; H03M 13/767; H03M 13/2782
See application file for complete search history.

(56) References Cited

U.S. PATENT DOCUMENTS

| | | | |
|---|---|---|---|
| 7,949,067 | B2 | 5/2011 | Ghosh et al. |
| 7,995,749 | B2 | 8/2011 | Michaels |
| 8,090,045 | B1 | 1/2012 | Lou et al. |
| 8,208,525 | B2 | 6/2012 | Taylor et al. |
| 8,220,058 | B2 | 7/2012 | De Jong |
| 8,351,528 | B2 | 1/2013 | Taylor et al. |
| 2003/0076873 | A1 | 4/2003 | Wengerter et al. |
| 2005/0169397 | A1 | 8/2005 | Goel et al. |
| 2007/0165847 | A1 | 7/2007 | Langin-Hooper et al. |
| 2009/0100314 | A1 | 4/2009 | Danninger et al. |
| 2009/0129497 | A1 | 5/2009 | Stopler et al. |
| 2009/0147724 | A1 | 6/2009 | Nimbalker et al. |
| 2010/0169738 | A1* | 7/2010 | Wu ........................ H04L 1/0042 714/752 |

OTHER PUBLICATIONS

Erratum 1 (May 2010) to Recommendation ITU-T, G. 709/Y.1331 (Dec. 2009), Interfaces for the Optical Transport Network (OTN), Covering Note; General Secretariat of the International Telecommunication Union, Geneva, May 4, 2010.

Extended European Search Report, dated Jan. 29, 2015, Application No. 12818122.9, Applicant: Cortina Systems, Inc., (8 pages).

Final Office Action (14 pages) dated Jun. 28, 2016 in U.S. Appl. No. 14/540,907.

"Interfaces for the Optical Transport Network (OTN)" Corrigendum 1; International Telecommunication Union; ITU-T; G.709/Y.1331 (Jul. 2010). Series G: Transmission Systems and Media, Digital Systems and Networks; Digital terminal equipments—General; Series Y: Global Information Infrastructure, Internet Protocol Aspects and Next-Generation Networks; Internet protocol Aspects—Transport.

Interfaces for the Optical Transport Network (OTN). International Telecommunication Union; ITU-T; G 709/Y.1331 (Dec. 2009). Series G: Transmission Systems and Media, Digital Systems and Networks: Digital terminal equipments—General Series Y: Global Information Infrastructure, Internet Protocol Aspects and Next-Generation Networks; Internet Protocol Aspects—Transport.

International Search Report and Written Opinion for International Application No. PCT/US2012/040020 dated Aug. 21, 2012, 14 pages.

Maria Kovaci et al. "The Performances of Interleavers Used in Turbo Codes", IEEE 2005, pp. 363-366.

Notice of Allowance and Notice of Allowability (6 pages), dated Aug. 2, 2013 in U.S. Appl. No. 13/190,194.

Notice of Allowance and Notice of Allowability (8 pages), dated Aug. Sep. 15, 2016 in U.S. Appl. No. 14/540,907.

Notice of Allowance and Notice of Allowability (5 pages), dated Aug. 5, 2014 in U.S. Appl. No. 14/066,332.

Office Action with attached Notice of References Cited (6 pages) dated Mar. 15, 2013 in U.S. Appl. No. 13/190,194.

Office Action with attached Notice of References Cited (6 pages) dated Jan. 31, 2014 in U.S. Appl. No. 14/066,332.

Office Action with attached Notice of References Cited (12 pages) dated Mar. 3, 2016 in U.S. Appl. No. 14/540,907.

Orhan Gazi et al. "Collision Free Row Column S-random Interleaver", IEEE Communications Leiters, vol. 13, No. 4, Apr. 2009, pp. 257-259.

* cited by examiner

TIME VARYING DATA PERMUTATION APPARATUS AND METHODS

This application is a continuation of U.S. patent application Ser. No. 15/378,904 filed Dec. 14, 2016, which is a continuation of U.S. patent application Ser. No. 14/540,907 filed on Nov. 13, 2014 (now U.S. Pat. No. 9,564,926 issued Feb. 7, 2017), which is a continuation of U.S. patent application Ser. No. 14/066,332 filed on Oct. 29, 2013 (now U.S. Pat. No. 8,910,016 issued Dec. 9, 2014), which is a continuation of U.S. patent application Ser. No. 13/190,194 filed on Jul. 25, 2011 (now U.S. Pat. No. 8,601,340 issued Dec. 3, 2013), the contents of each of which are incorporated in their entirety herein by reference.

FIELD OF THE INVENTION

This invention relates generally to error correction coding and, in particular, to permuting data for error decorrelation.

BACKGROUND

Most Forward-Error-Correction (FEC) codes are designed to perform under Additive White Gaussian Noise (AWGN). That is, a decoder assumes that noise samples in a received signal are uncorrelated and Gaussian distributed. The performance of these codes can substantially decrease if the noise that is added during transmission over a communication channel is actually correlated. Error decorrelators can be added to a FEC encoder and decoder to reduce the correlation of noise samples and the resultant data errors, so that coding performance can approach performance under AWGN conditions.

The memory size or depth that is required for data permutation in a conventional error decorrelator increases with the degree of correlation, since decorrelation of errors due to more highly correlated noise involves permutation of larger amounts of data and storage of that data in memory to enable the permutation. In general, the complexity of a conventional error decorrelator is linearly proportional to the throughput of data to be permuted, and is further proportional to the square of the memory depth. Complexity might refer to gate count and/or memory size in hardware, or to code size, code speed, and/or memory footprint of a function in software or firmware, for example. The linear proportionality of complexity to data throughput can be particularly problematic for high-speed communication channels operating at about 40 Gigabits per second (Gbps) and above, for instance.

BRIEF DESCRIPTION OF THE DRAWINGS

Examples of embodiments of the invention will now be described in greater detail with reference to the accompanying drawings.

DETAILED DESCRIPTION

The complexity of an error decorrelator is reduced by splitting data permutation into multiple permutation operations in respective different dimensions. The multiple permutation operations in multiple dimensions provide an overall effective data permutation using smaller blocks in each permutation than would be required to achieve the same degree of permutation in a classical error decorrelator design. The dimension of permutation is changed between permutation operations by interleaving data that is permuted in one permutation operation, and then permuting the interleaved permuted data in a subsequent permuting operation.

Permutation of smaller blocks of data can significantly reduce gate count and complexity as compared to a classical design that achieves the same overall degree of data permutation.

Figure 1:
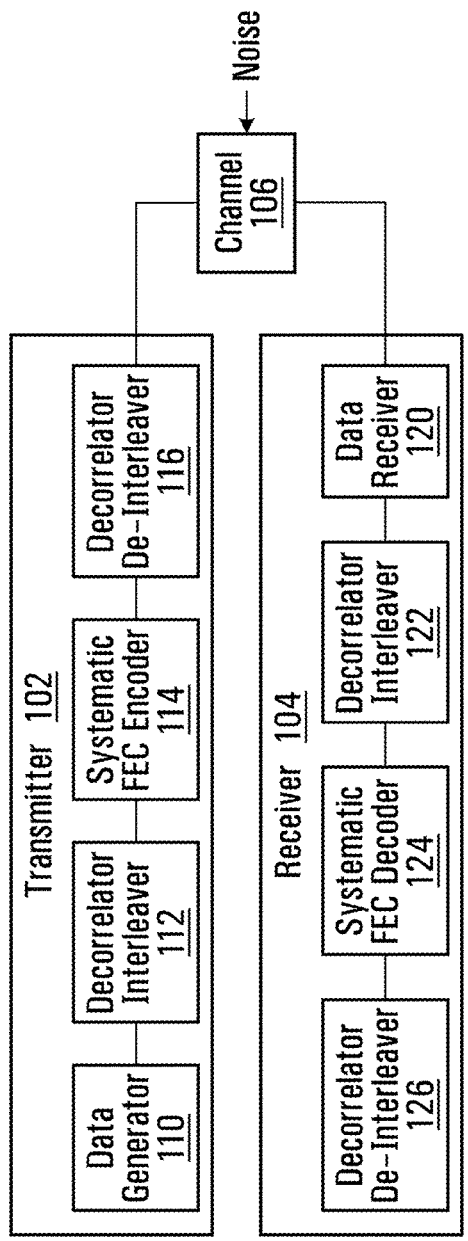
FIG. 1 is a block diagram of an example FEC system with error decorrelation.

FIG. 1 is a block diagram of an example FEC system 100 with error decorrelation. The example FEC system 100 includes a transmitter 102 and a receiver 104 which communicate via a communication channel 106. The communication channel could be an optical channel or some other type of channel. The transmitter 102 includes a data generator 110, a decorrelator interleaver 112, a systematic FEC encoder 114, and a decorrelator de-interleaver 116. The receiver 104 includes a data receiver 120, a decorrelator interleaver 122, a systematic FEC decoder 124, and a decorrelator de-interleaver 126.

A complete communication system might include many transmitters and receivers which use the same or different communication channels. Equipment in which or in conjunction with which the example transmitter 102 and receiver 104 are implemented could also include other components which have not been shown in FIG. 1 in order to avoid congestion in the drawing. It should therefore be appreciated that the example FEC system 100 of FIG. 1, as well as the contents of the other drawings, are intended solely for illustrative purposes, and that the present disclosure is in no way limited to the particular examples explicitly shown in the drawings.

The components of the transmitter 102 and the receiver 104 are operatively coupled together as shown. Components could be operatively coupled together through electrical, optical, and/or other types of connections, which might be direct connections as shown or indirect connections through one or more other components. Operative couplings could also or instead include non-physical connections such as logical connections between components implemented using elements that execute software. An operative coupling between such components could be in the form of shared or commonly accessed memory or register locations, for instance.

The data generator 110 is intended to represent a source of data. The data source could be part of the transmitter 102, or the data generator 110 might also or instead receive data from one or more external sources for transmission over the communication channel 106. The form of implementation of the data generator 110 might vary, for instance, depending on the type(s) of data to be handled, whether the data generator directly generates data or receives data from an external source, and/or other data handling features that are to be provided at the transmitter 102. In an example discussed in further detail below with reference to FIG. 6, the data generator 110 is implemented in the form of a frame generator which generates blocks of data in a certain frame format but need not necessarily directly generate data.

Examples of possible implementations of the data generator 110 include hardware, firmware, one or more processors executing software stored in computer readable storage, or some combination thereof. Application Specific Integrated Circuits (ASICs), Programmable Logic Devices (PLDs), Field Programmable Gate Arrays (FPGAs), and microprocessors for executing software stored on a non-transitory computer-readable medium such as a magnetic or optical disk or a solid state memory device, are examples of devices that might be suitable for implementing the data generator 110. Any or all of the other components of the transmitter 102, and similarly the receiver 104, could also be implemented in any of various ways.

The decorrelator interleavers 112, 122 at the transmitter 102 and the receiver 104 apply the same multi-dimensional data permutation to their input data streams, before FEC encoding and decoding, respectively. The FEC encoder 114 and the FEC decoder 124 employ systematic coding in the example FEC system 100. Systematic coding adds coding information to data rather than changing any data. The decorrelator de-interleavers 116, 126 implement the inverse permutations of the decorrelator interleavers 112, 122, respectively. This means that the sequence of data at the output of each decorrelator de-interleaver 116, 126 is the same as the sequence of data at the input of its corresponding decorrelator interleaver 112, 122. The decorrelator interleavers 112, 122 reorder data, and the decorrelator de-interleavers 116, 126 reverse that reordering to restore the original order of a data stream that is generated by the data generator 110 in the case of the transmitter 102 or a data stream that is received from the communication channel 106 in the case of the receiver 104.

The data receiver 120 in the example FEC system 100 could implement such receiver operations as equalization and data frame recovery, for example. In some embodiments, the data receiver 120 is a "protocol" counterpart of the data generator 110, such that a particular protocol runs between the data generator and the data receiver.

For systematic FEC coding, the decorrelator interleavers 112, 122 are designed in such a way that data locations are not mixed with systematic FEC parity locations. This allows the error decorrelation to be somewhat independent of the particular FEC code structure, apart from not mixing the data and parity locations, and makes the error decorrelation "transparent" to the systematic FEC encoder and decoder 114, 124.

Figure 2:
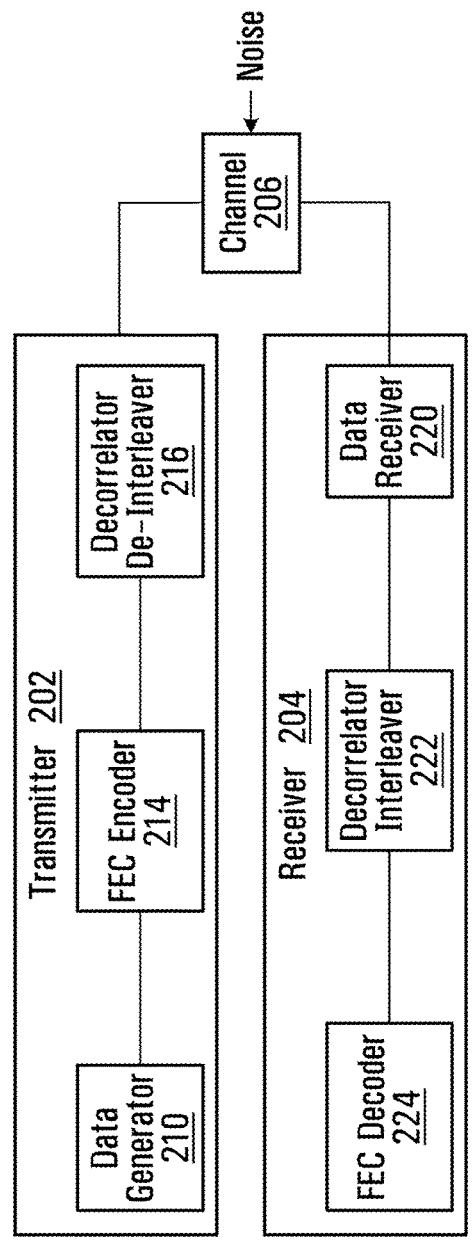
FIG. 2 is a block diagram of another example FEC system with error decorrelation.

In a non-systematic FEC system, it is possible to remove one decorrelator interleaver and one decorrelator de-interleaver to reduce the overall system complexity. This is shown in FIG. 2, which is a block diagram of another example FEC system with error decorrelation. The example FEC system 200 is substantially similar to the example FEC system 100 in FIG. 1, and includes a transmitter 202 with a data generator 210 and a decorrelator de-interleaver 216, a receiver 204 with a data receiver 220 and a decorrelator interleaver 222, and a channel 206. In the example FEC system 200, however, the FEC encoder and decoder 214, 224 are non-systematic, and there are no permutations at the input of the FEC encoder and the output of the FEC decoder. The decorrelator de-interleaver 216 and the decorrelator interleaver 222 apply inverse data permutations, to enable decorrelation of errors due to noise affecting the communication channel 206.

It should be appreciated that the designation of decorrelator components as decorrelator interleaver and decorrelator de-interleaver is arbitrary. A decorrelator interleaver and a corresponding decorrelator de-interleaver implement inverse overall data reordering, and either component could be designated as the decorrelator interleaver or as the decorrelator de-interleaver. Thus, the decorrelator de-interleaver 216 could be switched with the decorrelator interleaver 222. This also applies to the example FEC system 100 of FIG. 1 as well. In general, each decorrelator interleaver 112, 122 could be replaced with it corresponding decorrelator de-interleaver 116, 126, provided each decorrelator de-interleaver is also replaced with its corresponding decorrelator interleaver.

Another difference between the example FEC systems 100, 200 in FIGS. 1 and 2 is that the error decorrelation in FIG. 1 is protocol transparent. Where the data generator 110 in FIG. 1 generates frames in accordance with a particular protocol, for example, the output of the decorrelator de-interleaver 116 is also framed in accordance with the same protocol. In the example FEC system 200, however, permutation by the decorrelator de-interleaver 216 would change the order of data in an encoded data stream, and therefore this reordering would not be transparent to a protocol between the data generator 210 and the data receiver 220. The error decorrelation is still transparent to the FEC encoder and decoder 214, 224, but not to the data receiver 220.

Figure 3:
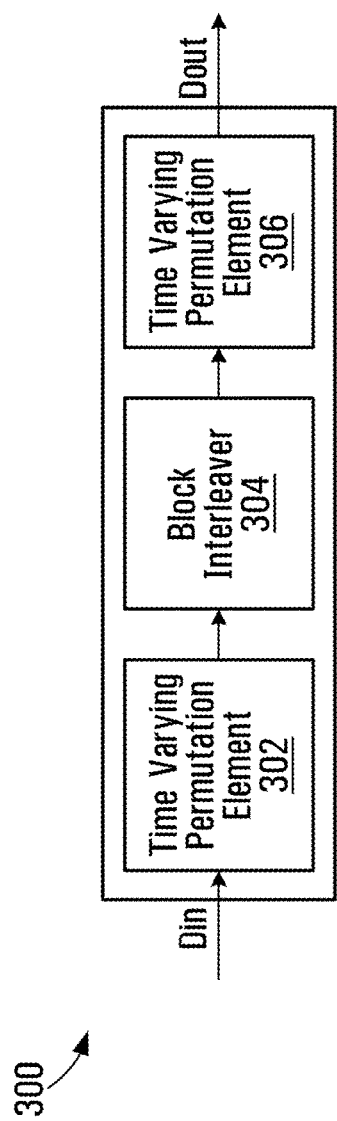
FIG. 3 is a block diagram of an example permutation apparatus.

FIG. 3 is a block diagram of an example permutation apparatus 300. The example permutation apparatus 300 could be used to implement the decorrelator interleavers in the example FEC systems 100, 200 in FIGS. 1 and 2, for instance. In the example permutation apparatus 300, a first time varying permutation element 302 is operatively coupled to receive an input data stream $D_{in}$, a block interleaver 304 is operatively coupled to an output of the first time varying permutation element, and a second time varying permutation element 306 is operatively coupled to an output of the block interleaver 304 and provides an output data stream $D_{out}$. In operation, the first time varying permutation element 302 applies a time varying first permutation to the input data stream $D_{in}$ to generate a first permuted data stream, the block interleaver 304 interleaves the first permuted data stream to generate an interleaved data stream, and the second time varying permutation element 306 applies a time varying second permutation to the interleaved data stream to generate a second permuted data stream.

The same type of structure as shown in FIG. 3 can also be used in implementing decorrelation de-interleavers, with the exception that the block interleaver 304 would be replaced with a block de-interleaver implementing the inverse of interleaving that is applied by a block interleaver in a decorrelator interleaver, and the time varying permutation elements 302 and 306 would implement the inverses of permutations applied by time varying permutation elements in the decorrelator interleaver.

Generally, the complexity of a time varying decorrelator interleaver or de-interleaver is proportional to the square of the interleaving depth. This makes large interleaver designs very inefficient. The example permutation apparatus 300, however, is partitioned into the three elements as shown, including the two time varying permutation elements 302, 306 and the block interleaver 304, which reduces complexity as discussed below.

Regarding complexity of the example permutation apparatus 300, suppose that the time varying permutation elements 302, 306 respectively apply length n time varying permutations P1 and P2, and that the block interleaver 304 applies a permutation on n by m elements. Proceeding from the input at $D_{in}$ to the output at $D_{out}$, data is first permuted by P1, then permuted by interleaving at the block interleaver 304 and finally is permuted by P2. This results in an overall n*m time varying permutation. The complexity of implementation of P1 and P2 is proportional to $n^2$. This should be compared with the complexity of direct implementation of a time varying n*m permutation, which is $m^2*n^2$. This means that a permutation apparatus of the form shown in FIG. 3 can result in substantial complexity reduction relative to a classical design for the same degree or level of data permutation.

The depth of the overall permutation can be chosen as a function of the error correlation length and the FEC code crossover probability of the particular FEC code in conjunction with which error decorrelation is to be implemented. As the permutation depth gets larger, noise at the output more closely approximates an uncorrelated source.

In an error decorrelation application, the example permutation apparatus 300 could be implemented in a data encoder that includes an encoder to encode a data stream to generate an encoded data stream. The first permutation element 302 could be operatively coupled to the encoder to apply a time varying first permutation to the encoded data stream.

Figure 3A:
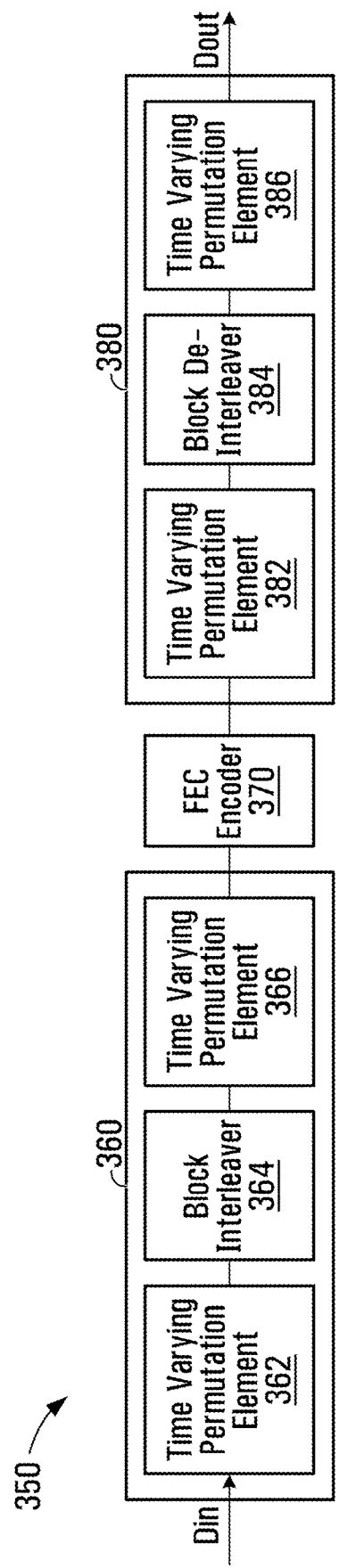
FIG. 3A is a block diagram of an example data encoder.

FIG. 3A is a block diagram of an example data encoder having this type of structure at the output of an encoder. The example data encoder 350 includes a first permutation apparatus 360, a FEC encoder 370, and a second permutation apparatus 380. Each of the first and second permutation apparatus 360, 380 includes a time varying permutation element 362, 382 operatively coupled to a block interleaver 364 or a block de-interleaver 384, which is operatively coupled to another time varying permutation element 366, 386. In this example data encoder 350, the FEC encoder 370 encodes a data stream, and the time varying permutation element 382 is operatively coupled to the encoder to apply a time varying permutation to the encoded data stream that is output by the FEC encoder.

The example data encoder 350 provides for protocol transparency, since the permutation apparatus 360, 380 implement a decorrelator interleaver and a decorrelator de-interleaver, respectively. The FEC encoder 370 is operatively coupled to the second time varying permutation element 366 of the permutation apparatus 360, to receive and encode the second permuted data stream to generate an encoded data stream at the FEC encoder output. The second permutation apparatus 380 includes a third time varying permutation element 382 operatively coupled to the FEC encoder 370 to apply to the encoded data stream at the output of the FEC encoder, a time varying third permutation which is an inverse permutation of the time varying second permutation applied by the second permutation element 366. This generates a third permuted data stream, which in this example is then provided to a block de-interleaver 384. The block de-interleaver 384 de-interleaves the third permuted data stream from the third time varying permutation element 382 to generate a de-interleaved data stream. De-interleaving applied by the block de-interleaver 384 is an inverse of interleaving applied by the block interleaver 364. The de-interleaved data stream is in turn provided to a fourth time varying permutation element 386. The fourth time varying permutation element applies a time varying fourth permutation to the de-interleaved data stream from the block de-interleaver 384. The time varying fourth permutation is an inverse permutation of the time varying first permutation applied by the time varying permutation element 362.

An architecture of the form shown in FIG. 3A could also be implemented in a data decoder, with or without protocol transparency. In a data decoder implementation, the FEC encoder 370 would be replaced with a FEC decoder, and the data stream $D_{in}$ would be an encoded data stream. The data decoder would include the FEC decoder operatively coupled to the second time varying permutation element 366 to receive and decode the second permuted data stream. For protocol transparency, the third time varying permutation element 382 could be operatively coupled to the FEC decoder to apply a time varying third permutation to the decoded data stream at the output of the FEC decoder to generate a third permuted data stream, with the time varying third permutation being an inverse permutation of the time varying second permutation that is applied by the second time varying permutation element 366. The block de-interleaver 384 then de-interleaves the third permuted data stream from the third time varying permutation element 382 by applying de-interleaving that is an inverse of interleaving applied by the block interleaver 364, to generate a de-interleaved data stream, and the fourth time varying permutation element 386 applies a time varying fourth permutation to the de-interleaved data stream at the output of the block de-interleaver 384. The time varying fourth permutation is an inverse permutation of the time varying first permutation applied by the time varying permutation element 362.

A protocol transparent data coding system could include both a data encoder and a data decoder that provide protocol transparency, with data permutation at the input and the output of both an encoder and a decoder. Where protocol transparency is provided, each of a data encoder and a data decoder could have an architecture of the form shown in FIG. 3A. In this case, there would be two decorrelator interleavers (one at the data encoder and one at the data decoder) and two decorrelator de-interleavers (one at the data encoder and one at the data decoder), each having four time varying permutation elements as shown at 362, 366, 382, 386, a block interleaver as shown at 364, and a block de-interleaver as shown at 384. Thus, between the data encoder and the data decoder, there would be a total of eight time varying permutation elements (four at the data encoder and four at the data decoder), two block interleavers (one at the data encoder and one at the data decoder), and two block de-interleavers (one at the data encoder and one at the data decoder). Time varying permutations applied by the time varying permutation elements at the data decoder would match those applied by the corresponding time varying permutation elements at the data encoder. Similarly, interleaving and de-interleaving applied by the block interleaver and the block de-interleaver at the data decoder would match the interleaving and de-interleaving applied by the block interleaver and the block de-interleaver at the data decoder.

In a data coding system without protocol transparency, data permutation would instead be applied only after the output of an encoder and before the input of a decoder. With reference to FIG. 3A, a data encoder might then include the FEC encoder 370 and the permutation apparatus 380 as a decorrelator de-interleaver, with a data decoder including the permutation apparatus 360 as a decorrelator interleaver operatively coupled to a FEC decoder, for example.

Figure 4:
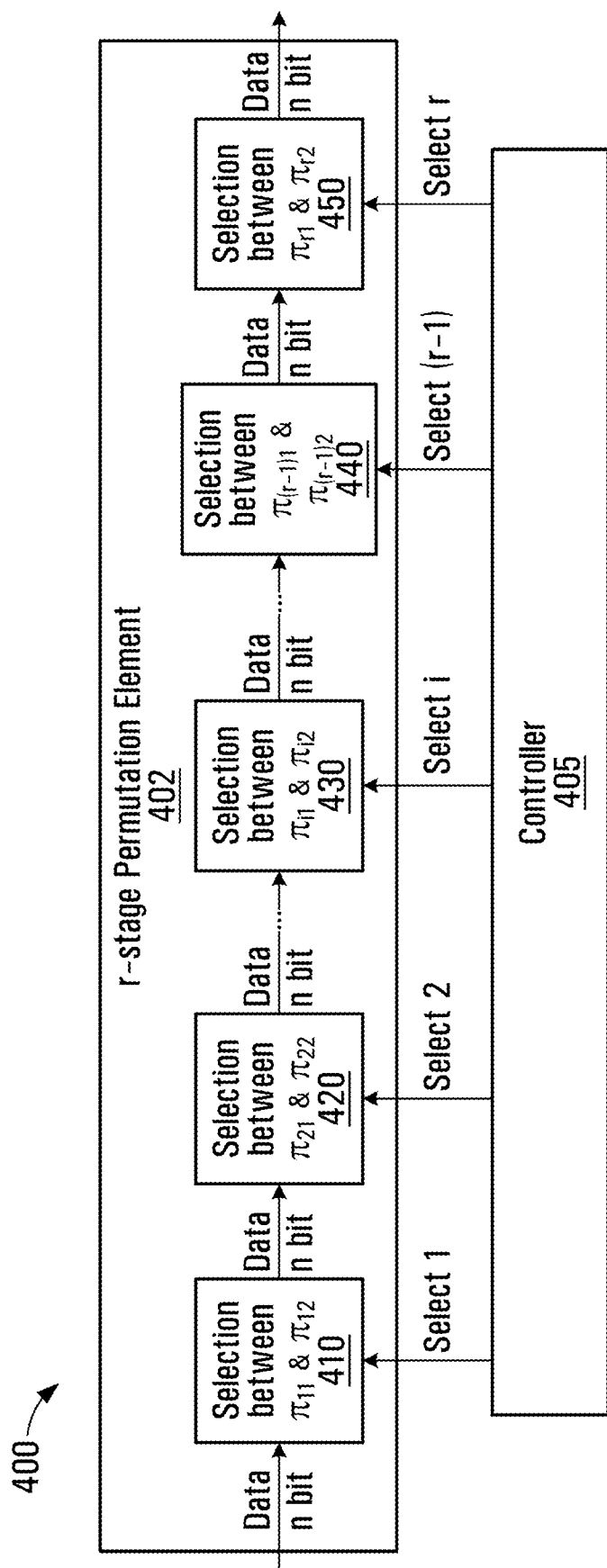
FIG. 4 is a block diagram of an example permutation element.

FIG. 4 is a block diagram of an example permutation element 400, which could be used to implement the time varying permutation elements 302, 306 in the example permutation apparatus 300 shown in FIG. 3 and/or the time varying permutation elements 362, 366, 382, 386 shown in FIG. 3A. The example permutation element 400 includes a multiple-stage permutation element 402 and a controller 405. The multiple-stage permutation element 402 includes a serial cascade of r permutation stages 410, 420, 430, 440, 450. At each ith permutation stage 410, 420, 430, 440, 450, the controller 405 controls a selection between one of two permutation maps $\pi_{i1}$, $\pi_{i2}$, each of which provides a respective different mapping between data positions or locations in an input data stream and a permuted (output) data stream. The controller 405 dynamically changes signals on the select lines, resulting in a time varying permutation. The permutation maps $\pi_{i1}$, $\pi_{i2}$ at each permutation stage 410, 420, 430, 440, 450 can be chosen to achieve a desired level of "pseudo-randomness" in the resultant r-stage permutation.

Not every permutation map $\pi_{i1}$, $\pi_{i2}$ need necessarily be random. For example, all $\pi_{i1}$ could be set to identity I and all $\pi_{i2}$ could be set to respective pseudo-random maps. In this type of implementation, each permutation stage 410, 420, 430, 440, 450 could be individually turned "off" by selecting the identity permutation map $\pi_{i1}$ or turned "on" by selecting the pseudo-random map $\pi_{i2}$.

A very simple algorithm could potentially be used by the controller 405 to control permutation map selection at each permutation stage 410, 420, 430, 440, 450. For example, a binary counter counting from 0 to $2^r-1$ could be implemented as the controller 405 to provide a time varying r-bit control signal and thus a time varying r-stage permutation. The binary counter in this example could be driven by the same reference clock that is used to clock one or more other components for instance, such that the time varying r-stage permutation at each permutation stage 410, 420, 430, 440, 450 changes for each clock cycle. Other embodiments could use more slowly or more quickly varying permutations. The actual selection at each stage could be implemented using a switch, multiplexer, or some other form of selector.

A permutation element of the form shown in FIG. 4 could be used to implement each of multiple permutations in a permutation apparatus. Control signals for each permutation, in a control pair (p1_control, p2_control) where there are two permutations P1, P2, for instance, could be generated independently, so as to increase the number of possible combinations of different overall pseudo-random permutations that could be applied by a permutation apparatus over time. Each of first and second permutation elements in this example would include a respective set of serially coupled permutation stages.

With reference to FIG. 1, within the transmitter 102, for example, time varying permutations applied at the decorrelator interleaver 112 and the decorrelator de-interleaver 116 are coordinated so that the decorrelator de-interleaver can apply the inverse of the time varying permutation that was applied at the decorrelator interleaver. Where the decorrelator interleaver 112 and the decorrelator de-interleaver 116 include permutation elements having a structure as shown in FIG. 4, this type of coordination involves coordination of control signals that are supplied to the de-interleaver with those that are supplied to the interleaver, so that data to which a particular permutation is applied also has the correct inverse permutation applied. At the receiver 104, control signals within the decorrelator interleaver 122 and the decorrelator de-interleaver 126 are similarly coordinated.

Coordination of transmit-side permutations with receive-side permutations is also provided in systems which support protocol transparency. With reference again to FIG. 1, the decorrelator interleavers 112, 122 apply the same permutations, and the decorrelator de-interleavers 116, 126 apply the same inverse permutations. In a synchronized data system, the same synchronization mechanism that is used to synchronize the data could also be used to coordinate permutation control signals. Where the controller 405 is implemented using a counter, for example, control signals could be coordinated by synchronizing the counters at the decorrelator interleavers 112, 122 and the decorrelator de-interleavers 116, 126 based on data synchronization.

In FIG. 4, all of the permutation stages 410, 420, 430, 440, 450 are controllable. Time varying permutations could be provided with at least one controllable permutation stage, but not every permutation stage need necessarily be implemented as a controllable stage. Each controllable permutation stage is controllable to select, from different permutation maps, a respective permutation map to be applied by that controllable permutation stage. Fixed stages, if any, apply fixed permutation maps. In combination with one or more controllable permutation stages, even fixed permutation stages could be used to provide an overall time varying permutation.

It should also be noted that any or all permutation stages 410, 420, 430, 440, 450 could provide more than two permutation maps. Selection between more than two maps could be supported by providing multi-bit binary select signals, for example.

FIG. 4 and the corresponding description thereof relate to an example permutation element. Regarding block interleavers and block de-interleavers, a fixed map or several fixed maps for permuting a data stream in multiple dimensions could be used. A matrix transpose, for example, could be used to interleave/de-interleave a permuted data stream generated by a permutation element. Where a block interleaver/de-interleaver implements several maps, the block interleaver/de-interleaver could also be coupled to a controller. An interleaver controller could be the same controller 405 (FIG. 4) that controls selections between permutation maps, or possibly a separate controller.

Figure 5:
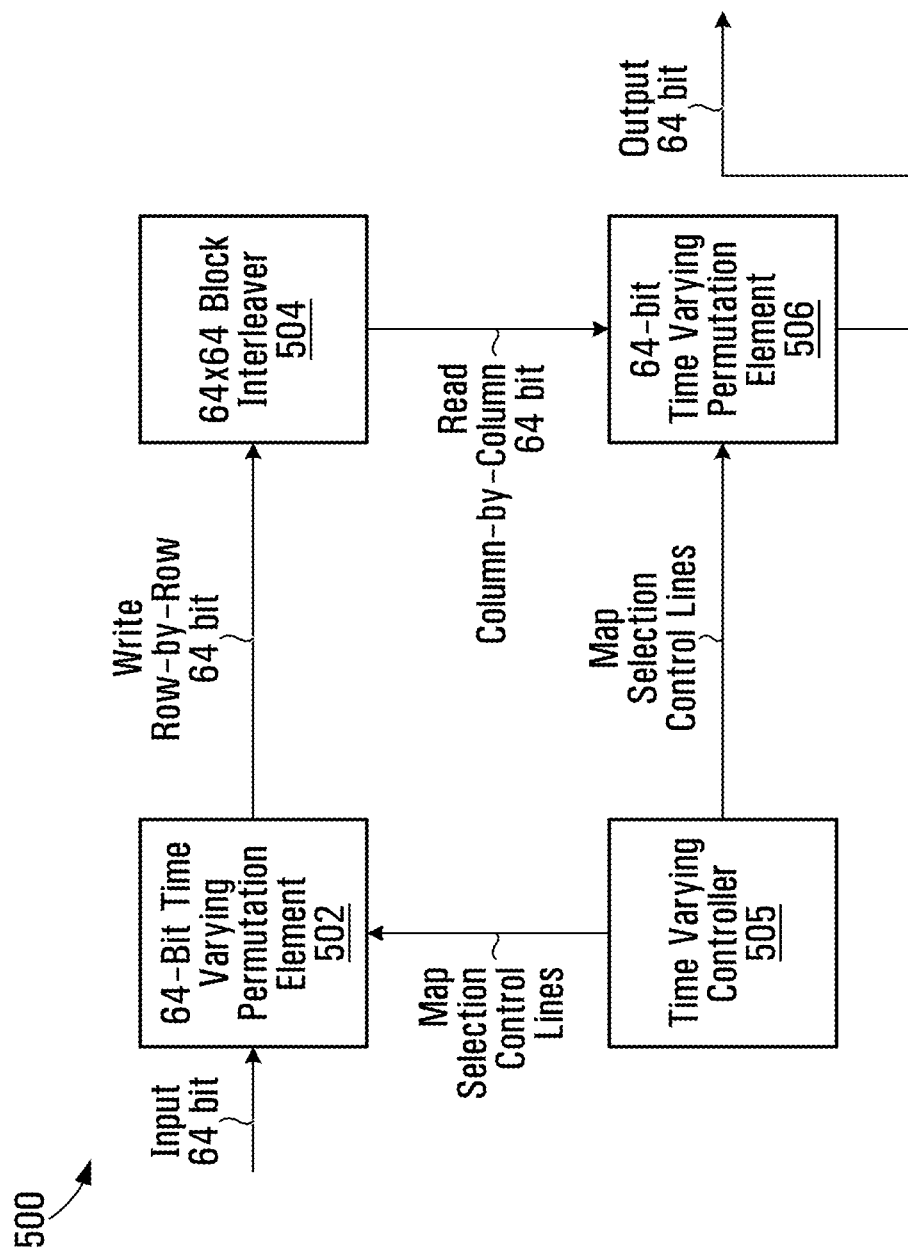
FIG. 5 is a block diagram of another example permutation apparatus.

FIG. 5 is a block diagram of another example permutation apparatus 500, which includes two permutation elements 502, 506 that could each be implemented as shown in FIG. 4 to apply respective 64-bit time varying permutations under control of the controller 505, and a 64-bit by 64-bit block interleaver 504, which could be implemented using one or more memory devices. In this example permutation apparatus 500, a 64-bit data stream is received by the permutation element 502, which applies a 64-bit time varying permutation to the data stream and fills the 64-bit by 64-bit block interleaver 504 row-by-row. This 64-bit by 64-bit block of data is then read column-by-column and passed through a second 64-bit time-varying permutation, which is applied by the permutation element 506. The controller 505 controls the selection of the permutation maps to be applied by the permutation elements 502, 506.

The example permutation apparatus 500, with two 64-bit permutations and a 64-bit by 64-bit matrix transpose for the block interleaver 504, provides an overall permutation depth of n*m=64*64=4096 bits. Complexity of the time varying permutation elements is proportional to $n^2=64^2$, instead of $(n*m)^2=4096^2$ as in a classical design to achieve a permutation depth of 4096 bits.

The present disclosure is not in any way limited to the example permutation apparatus 500 as shown in FIG. 5. In another embodiment, data permutation is applied to a 100 Gbps data stream using a two-dimensional block interleaver and 320-bit time varying permutations P1 and P2. Other embodiments are also possible.

Figure 6:
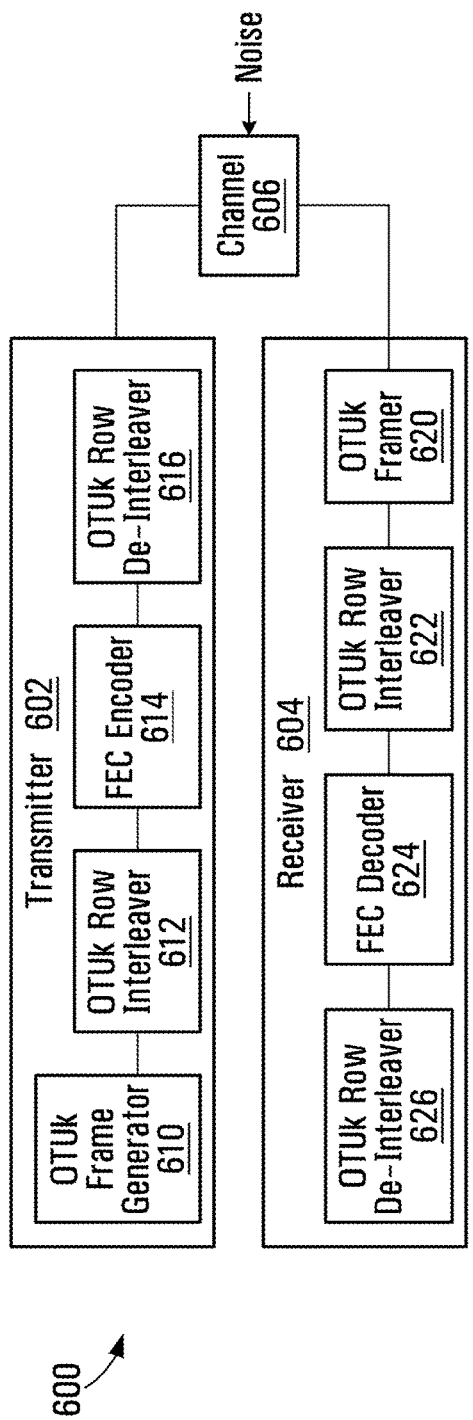
FIG. 6 is a block diagram of an example FEC system in an Optical Transport Network (OTN) application.

FIG. 6 is a block diagram of an example FEC system in an Optical Transport Network (OTN) application. In the example FEC system 600, a transmitter 602 and a receiver 604 communicate through an optical communication channel 606. The transmitter 602 and the receiver 604 are similar in structure to the transmitter 102 and the receiver 104 in the example FEC system 100 (FIG. 1), but are specific to an OTN application. Thus, the transmitter 602 includes an Optical channel Transport Unit (OTUk) frame generator 610 as an example of a data receiver, an OTUk row interleaver 612 and de-interleaver 616 as examples of a decorrelator interleaver and de-interleaver, and a FEC encoder 614. At the receiver 604, the OTUk framer 620 which recovers OTUk frames from signals received over the optical channel 606, is an example of a data receiver. The OTUk row interleaver 622 and the OTUk row de-interleaver 626 represent examples of a receive side decorrelator interleaver and de-interleaver. The receiver 604 also includes a FEC decoder 624.

OTUk signals are defined in Recommendation G.709/Y.1331 by the Telecommunication Standardization section of the ITU (ITU-T), entitled "Interfaces for the Optical Transport Network (OTN)", December 2009, with an Erratum 1 (May 2010), an Amendment 1 (July 2010), and a Corrigendum 1 (July 2010). G.709 defines a number of layers in an OTN signal hierarchy. Client signals are encapsulated into Optical channel Payload Unit (OPUk) signals at one of k levels of the OTN signal hierarchy. An Optical channel Data Unit (ODUk) carries the OPUk and supports additional functions such as monitoring and protection switching. OTUk adds FEC coding. Optical Channel (OCh) signals in G.709 are in the optical domain, and result from converting OTUk signals from electrical form to optical form. Further details on OTUk signals can be found in G.709.

One option to make data permutation for error decorrelation as disclosed herein compatible with the OTN OTUk row format is to design the overall permutations as follows:

a 12-stage 64-bit permutation for each of first and second permutations P1 and P2;

a 40-bit by 64-bit=2560-bit matrix transpose function for block interleaving between P1 and P2 for the first 11 blocks of 2560 bits of data;

a 38-bit by 64-bit=2432-bit matrix transpose function for block interleaving between P1 and P2 for the 12th block of data, which is the last block of data in an OTUk row;

a 32-bit by 64-bit=2048-bit matrix transpose function for block interleaving between P1 and P2 for the 13th block, which includes parity bits in an OTUk row.

Note that 11×2560+2432=30592 bits, which is the size of the data block in an OTUk row, and there are 2048 bits in an OTUk row. With the above set of block interleaving maps, the data and parity bits are not mixed.

To control P1 and P2 in this example, binary counters p1_cnt and p2_cnt could be used, with p1_cnt varying from 1 to 4095 and p2_cnt varying from 1 to (4095-41). Since the number 41 is prime, the pair (p1_cnt, p2_cnt) will traverse a large number of combinations before wrap around.

To synchronize the state of the controllers between the receiver and the transmitter, the OTUk MFAS byte can be used. For example, (p1_cnt, p2_cnt) could be forced to (1,1) every time MFAS=0. Since MFAS is an 8-bit value, the total distinct number of control pairs is 256×4×32640/64=522,240, which is a large number resulting in a good overall randomization of permutations for the error decorrelation.

Figure 7:
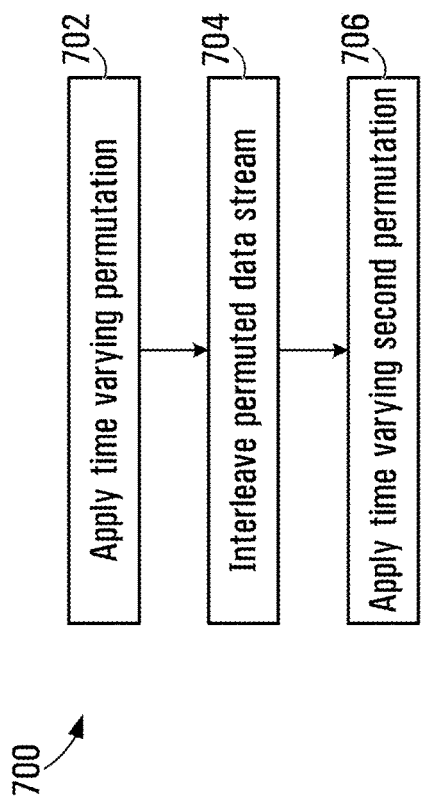
FIG. 7 is a flow diagram illustrating an example data permutation method.

FIG. 7 is a flow diagram illustrating an example data permutation method. The example data permutation method 700 involves applying a time varying first permutation to a data stream to generate a first permuted data stream at 702, interleaving the first permuted data stream to generate an interleaved data stream at 704, and applying a time varying second permutation to the interleaved data stream to generate a second permuted data stream at 706.

The example data permutation method 700 is intended solely for illustrative purposes. Variations are contemplated.

For example, the applying operations at 702, 706 might involve selecting, from multiple different permutation maps, at least one respective permutation map to be applied in each operation. Additional operations such as encoding and/or decoding, possibly in combination with further applying/interleaving/applying cycles to provide for protocol transparency, could be performed in some embodiments. Further variations might be or become apparent to a skilled person, based on FIGS. 1 to 6 and the foregoing description thereof, for instance.

Overview

In accordance with the present disclosure, an apparatus for permuting data in a data stream could include a first permutation element to apply a time varying first permutation to a data stream to generate a first permuted data stream; a block interleaver operatively coupled to the first permutation element, to interleave the first permuted data stream to generate an interleaved data stream; and a second permutation element operatively coupled to the block interleaver, to apply a time varying second permutation to the interleaved data stream to generate a second permuted data stream.

The first permutation element could include a first plurality of serially coupled permutation stages, and the second permutation element could include a second plurality of serially coupled permutation stages. Each of the first plurality of serially coupled permutation stages and the second plurality of serially coupled permutation stages could include at least one controllable permutation stage, with each controllable permutation stage being controllable to select, from a plurality of different permutation maps, a respective permutation map to be applied by each of the at least one controllable permutation stage. The could also include a controller operatively coupled to the at least one controllable permutation stage, to generate a time varying control signal for controlling selection of the respective permutation map to be applied by each of the at least one controllable permutation stage. The plurality of different permutation maps could include pseudo-random permutation maps.

In an embodiment, the block interleaver implements a matrix transpose to interleave the first permuted data stream.

A data encoder could include an apparatus as described above; an encoder operatively coupled to the second permutation element to receive and encode the second permuted data stream to generate an encoded data stream; a third permutation element operatively coupled to the encoder to apply a time varying third permutation to the encoded data stream to generate a third permuted data stream, with the time varying third permutation being an inverse permutation of the time varying second permutation; a block de-interleaver operatively coupled to the third permutation element, to de-interleave the third permuted data stream to generate a de-interleaved data stream, with the de-interleaving applied by the block de-interleaver being an inverse of interleaving applied by the block interleaver; and a fourth permutation element operatively coupled to the block de-interleaver, to apply a time varying fourth permutation to the de-interleaved data stream to generate a fourth permuted data stream, with the time varying fourth permutation being an inverse permutation of the time varying first permutation.

In another embodiment, a data encoder includes an encoder to encode a data stream to generate an encoded data stream; and an apparatus as described above, with the first permutation element being operatively coupled to the encoder to apply the time varying first permutation to the encoded data stream.

A data decoder could include an apparatus as described above; and a decoder operatively coupled to the second permutation element to receive and decode the second permuted data stream to generate a decoded data stream.

Such a data decoder could also include a third permutation element operatively coupled to the decoder to apply a time varying third permutation to the decoded data stream to generate a third permuted data stream, with the time varying third permutation being an inverse permutation of the time varying second permutation; a block de-interleaver operatively coupled to the third permutation element, to de-interleave the third permuted data stream to generate a de-interleaved data stream, with the de-interleaving applied by the block de-interleaver being an inverse of interleaving applied by the block interleaver; and a fourth permutation element operatively coupled to the block de-interleaver, to apply a time varying fourth permutation to the de-interleaved data stream, the time varying fourth permutation being an inverse permutation of the time varying first permutation.

A data coding system could include a data encoder as described above, and a data decoder operatively coupled to the data encoder. The data decoder could include a fifth permutation element operatively coupled to receive the fourth permuted data stream and to apply a time varying fifth permutation to the fourth permuted data stream to generate a fifth permuted data stream, with the time varying fifth permutation matching the time varying first permutation; a second block interleaver operatively coupled to the fifth permutation element, to interleave the fifth permuted data stream to generate a second interleaved data stream, with the interleaving applied by the second block interleaver matching interleaving applied by the block interleaver; a sixth permutation element operatively coupled to the second block interleaver, to apply a time varying sixth permutation to the second interleaved data stream to generate a sixth permuted data stream, with the time varying sixth permutation matching the time varying second permutation; a decoder operatively coupled to the sixth permutation element to decode the sixth permuted data stream to generate a decoded data stream; a seventh permutation element operatively coupled to the decoder to apply a seventh time varying permutation to the decoded data stream to generate a seventh permuted data stream, with the time varying seventh permutation matching the time varying third permutation; a second block de-interleaver operatively coupled to the seventh permutation element, to de-interleave the seventh permuted data stream to generate a second de-interleaved data stream, with the de-interleaving applied by the second block de-interleaver matching de-interleaving applied by the block de-interleaver; and an eighth permutation element operatively coupled to the second block de-interleaver, to apply a time varying eighth permutation to the second de-interleaved data stream to generate an eighth permuted data stream, with the time varying eighth permutation matching the time varying fourth permutation.

In another embodiment, the data decoder includes a third permutation element operatively coupled to receive the second permuted data stream and to apply a time varying third permutation to the second permuted data stream to generate a third permuted data stream, with the time varying third permutation being an inverse permutation of the time varying second permutation; a block de-interleaver operatively coupled to the third permutation element, to de-interleave the third permuted data stream to generate a de-interleaved data stream, with the de-interleaving applied by the block de-interleaver being an inverse of interleaving applied by the block interleaver; a fourth permutation element operatively coupled to the block de-interleaver, to apply a time varying fourth permutation to the de-interleaved data stream to generate a fourth permuted data stream, with the time varying fourth permutation being an inverse permutation of the time varying first permutation; and a decoder operatively coupled to the fourth permutation element to decode the fourth permuted data stream to generate a decoded data stream.

A method for permuting data in a data stream may include applying a time varying first permutation to a data stream to generate a first permuted data stream; block interleaving the first permuted data stream to generate an interleaved data stream; and applying a time varying second permutation to the interleaved data stream to generate a second permuted data stream.

The operation of applying a time varying first permutation could involve selecting, from a first plurality of different permutation maps, at least one permutation map to be applied to the data stream, and the applying a time varying second permutation could involve selecting, from a second plurality of different permutation maps, at least one permutation map to be applied to the interleaved data stream.

A method could also include encoding the second permuted data stream to generate an encoded data stream; applying a time varying third permutation to the encoded data stream to generate a third permuted data stream, with the time varying third permutation being an inverse permutation of the time varying second permutation; block de-interleaving the third permuted data stream to generate a de-interleaved data stream, with the block de-interleaving being an inverse of the block de-interleaving; and applying a time varying fourth permutation to the de-interleaved data stream to generate a fourth permuted data stream, the time varying fourth permutation being an inverse permutation of the time varying first permutation.

In an embodiment, a method also involves encoding a data stream to generate an encoded data stream, and the operation of applying a time varying first permutation involves applying the time varying first permutation to the encoded data stream.

The data stream could be an encoded data stream, in which case a method could also include decoding the second permuted data stream.

A method could additionally include applying a time varying third permutation to the decoded data stream to generate a third permuted data stream, with the time varying third permutation being an inverse permutation of the time varying second permutation; block de-interleaving the third permuted data stream to generate a de-interleaved data stream, with the block de-interleaving being an inverse of the block interleaving; and applying a time varying fourth permutation to the de-interleaved data stream, the time varying fourth permutation being an inverse permutation of the time varying first permutation.

A data coding method could include a method as described above; applying a time varying fifth permutation to the fourth permuted data stream to generate a fifth permuted data stream, with the time varying fifth permutation matching the time varying first permutation; block interleaving the fifth permuted data stream to generate a second interleaved data stream, with the block interleaving matching the block interleaving of the first permuted data stream; applying a time varying sixth permutation to the second interleaved data stream to generate a sixth permuted data stream, with the time varying sixth permutation matching the time varying second permutation; decoding the sixth permuted data stream to generate a decoded data stream; applying a time varying seventh permutation to the decoded data stream to generate a seventh permuted data stream, with the time varying seventh permutation matching the time varying third permutation; block de-interleaving the seventh permuted data stream to generate a second de-interleaved data stream, with the block de-interleaving matching the block de-interleaving of the third permuted data stream; and applying a time varying eighth permutation to the second de-interleaved data stream, with the time varying eighth permutation matching the time varying fourth permutation.

Another data coding method involves a method as described above; applying a time varying third permutation to the second permuted data stream to generate a third permuted data stream, with the time varying third permutation being an inverse permutation of the time varying second permutation; block de-interleaving the third permuted data stream to generate a de-interleaved data stream, with the block de-interleaving being an inverse of the block interleaving; applying a time varying fourth permutation to the de-interleaved data stream to generate a fourth permuted data stream, with the time varying fourth permutation being an inverse permutation of the time varying first permutation; and decoding the fourth permuted data stream.

According to another embodiment, an apparatus for permuting data in a data stream includes means for applying a time varying first permutation to a data stream to generate a first permuted data stream; means for block interleaving the first permuted data stream to generate an interleaved data stream; and means for applying a time varying second permutation to the interleaved data stream to generate a second permuted data stream.

CONCLUSION

What has been described is merely illustrative of the application of principles of embodiments of the invention. Other arrangements and methods can be implemented by those skilled in the art without departing from the scope of the present invention.

For example, the divisions of functions shown in FIGS. 1 to 6 are intended solely for illustrative purposes.

In addition, although described primarily in the context of methods and systems, other implementations are also contemplated, as a non-transitory computer-readable medium storing instructions executable by a machine, for example.

We claim:

1. A data encoder system comprising:
a first permutation apparatus comprising a first time-varying permutation element, the first permutation apparatus being configured to generate a first time-varying stream;
a Forward Error Correction (FEC) encoder configured to encode the first time-varying stream to generate an encoded stream; and
a second permutation apparatus comprising a second time-varying permutation element, the second time-varying permutation element being configured to generate a second time-varying stream based on the encoded stream.

2. The data encoder system of claim 1 wherein the first permutation apparatus further comprising a block interleaver configured to generate an interleaved data stream, the first-time varying stream being generated based on the interleaved data stream.

3. The data encoder of claim 1 wherein the second permutation apparatus comprises a de-interleaver configured to de-interleave the second time-varying stream.

4. The data encoder of claim 1 wherein the first permutation apparatus is configured to process an input data stream.

5. The data encoder of claim 1 wherein the second permutation apparatus is configured to generate an encoded output data stream based on the second-time varying stream.

6. The data encoder of claim 1 wherein the second permutation apparatus further comprises a third time-varying permutation element for performing inverse permutation.

7. The data encoder of claim 1 wherein the first time-varying permutation element comprises a plurality of permutation stages.

8. The data encoder of claim 7 wherein the first time-varying permutation element further comprises a controller coupled to the plurality of permutation stages.

9. The data encoder of claim 1 wherein the first time-varying permutation element is configured to apply a 64-bit permutation process.

10. A data decoder system comprising:
a first permutation apparatus comprising a first time-varying permutation element, the first permutation apparatus being configured to generate a first time-varying stream based on an encoded data stream;
a Forward Error Correction (FEC) decoder configured to decode the first time-varying stream to generate a decoded stream; and
a second permutation apparatus comprising a second time-varying permutation element, the second time-varying permutation element being configured to generate a second time-varying stream based on the decode stream.

11. The data decoder system of claim 10 wherein the first permutation apparatus further comprising a block interleaver configured to generate an interleaved data stream, the first-time varying stream being generated based on the interleaved data stream.

12. The data decoder system of claim 10 wherein the second permutation apparatus comprises a de-interleaver configured to de-interleave the second time-varying stream.

13. The data decoder system of claim 10 wherein the first permutation apparatus is configured to process an encoded input data stream.

14. The data decoder system of claim 10 wherein the second permutation apparatus is configured to generate a decoded output data stream based on the second-time varying stream.

15. The data decoder system of claim 10 wherein the second permutation apparatus further comprises a third time-varying permutation element for performing inverse permutation.

16. The data decoder system of claim 10 wherein the first time-varying permutation element comprises a plurality of permutation stages.

17. The data decoder system of claim 16 wherein the first time-varying permutation element further comprises a controller coupled tot plurality of permutation stages.

18. A data transmitter comprising:
a data source for generating a data stream;
a first permutation apparatus comprising a first time-varying permutation element, the first permutation apparatus being configured to generate a first time-varying stream based on the data stream;

a Forward Error Correction (FEC) encoder configured to encode the first time-varying stream to generate an encoded stream; and a second permutation apparatus configured to generate a second time-varying stream based on the encoded stream.

19. The data transmitter of claim 18 wherein the data source comprises a data generator.

20. The data transmitter of claim 18 further comprising a de-interleaver configured to de-interleave the second time-varying stream.

* * * * *